United States Patent [19]

Ogino

[11] Patent Number: 5,188,987
[45] Date of Patent: Feb. 23, 1993

[54] METHOD OF MANUFACTURING A SEMICONDUCTOR DEVICE USING A POLISHING STEP PRIOR TO A SELECTIVE VAPOR GROWTH STEP

[75] Inventor: Masanobu Ogino, Yokosuka, Japan

[73] Assignee: Kabushiki Kaisha Toshiba, Kawasaki, Japan

[21] Appl. No.: 714,348

[22] Filed: Jun. 12, 1991

Related U.S. Application Data

[63] Continuation of Ser. No. 506,182, Apr. 9, 1990, abandoned.

[30] Foreign Application Priority Data

Apr. 10, 1989 [JP] Japan .................................. 1-87954

[51] Int. Cl.$^5$ .................... H01L 21/00; H01L 21/02; H01L 21/76; H01L 21/306
[52] U.S. Cl. .................................. 437/228; 437/235; 437/238; 148/DIG. 17; 156/662
[58] Field of Search ............... 437/160, 225, 228, 233, 437/235, 238; 156/345, 643, 662; 148/DIG. 17

[56] References Cited

U.S. PATENT DOCUMENTS

| | | | |
|---|---|---|---|
| 3,898,351 | 8/1975 | Kennison et al. | 427/57 |
| 3,979,239 | 9/1976 | Walsh | 437/225 |
| 4,043,861 | 8/1977 | Jacob et al. | 156/636 |
| 4,244,775 | 1/1981 | D'Asaro | 156/636 |
| 4,448,634 | 5/1984 | Lampert | 156/636 |
| 4,493,142 | 1/1985 | Huang | 437/923 |
| 4,526,631 | 7/1985 | Silvestri et al. | 437/97 |
| 4,745,088 | 5/1988 | Inoue et al. | 437/225 |

FOREIGN PATENT DOCUMENTS

| | | |
|---|---|---|
| 0165085 | 12/1985 | European Pat. Off. . |
| 0224646 | 6/1987 | European Pat. Off. . |
| 0257541 | 12/1985 | Japan . |
| 0255914 | 10/1988 | Japan . |

OTHER PUBLICATIONS

Wolf, S., Silicon Processing for the VLSI Era, vol. 1, 1986, Lattice Press, pp. 189–191.
Beyer, Glass Planarization by Stop-Layer Polishing, IBM Tech. Discl. Bull., vol. 27, No. 8, Jan. 1985, pp. 4700–4701.
Shibata, Low Resistive and Selective Silicon Growth as a Self-Aligned Contact Hole Filler and Its Application to 1M bit Static Ram, VLSI Symp. Dig. of Tech. Papers, 1987, p. 75.
Shibata, High Performance Half Micron PMOSFETS with 0.1 $\mu$m Shallow P+N Junction Utilizing Selective Silicon Growth and Rapid Thermal Annealing, Proceedings of the IEDM, Dec. 1987, p. 590.
Ghandhi, S., VLSI Fabrication Principles, 1983, Wiley & Sons, pp. 424,425, 517–519.

Primary Examiner—Brian E. Hearn
Assistant Examiner—B. Everhart
Attorney, Agent, or Firm—Finnegan, Henderson, Farabow, Garrett and Dunner

[57] ABSTRACT

A method of manufacturing a semiconductor device comprises the steps of performimg selective vapor growth on a semiconductor substrate, and polishing a surface of an insulative film formed on said semiconductor substrate subsequent to the selective vapor growth step.

11 Claims, 3 Drawing Sheets

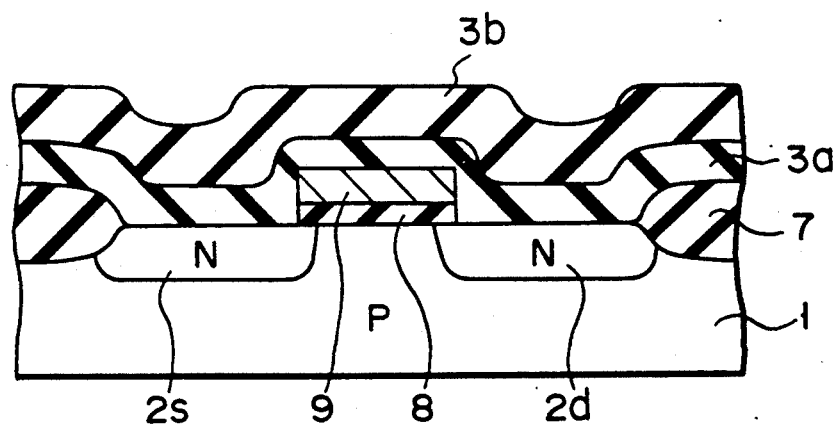
F I G. 1A
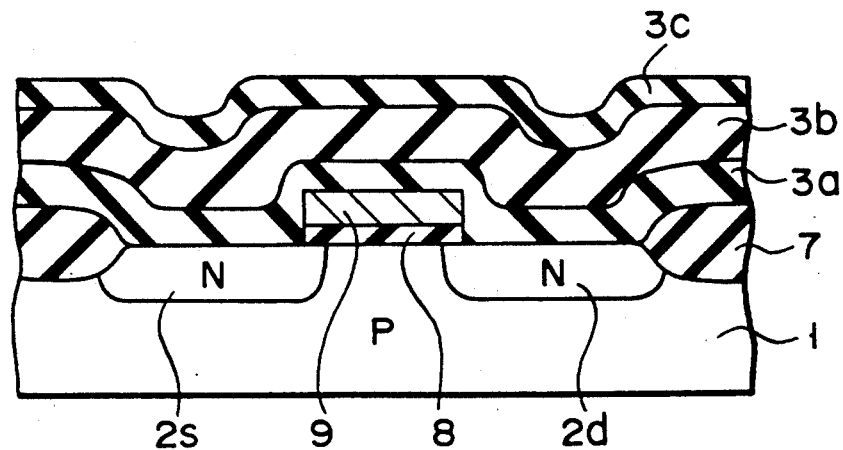
F I G. 1B
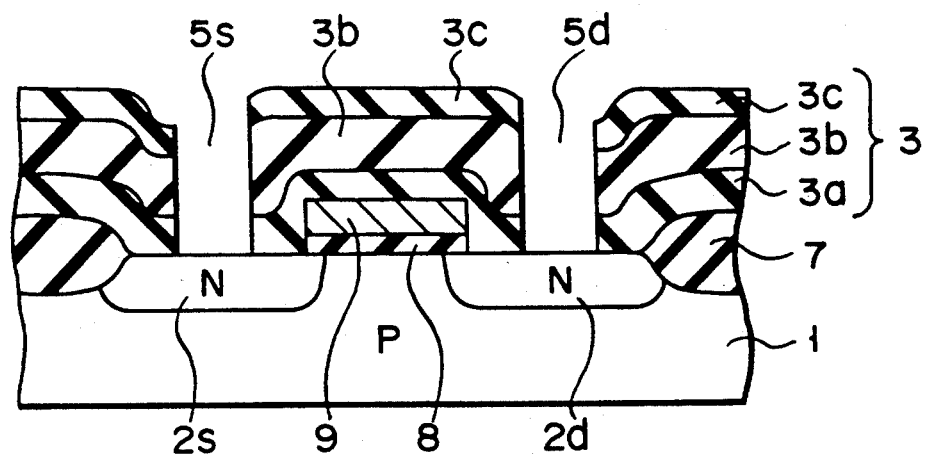
F I G. 1C

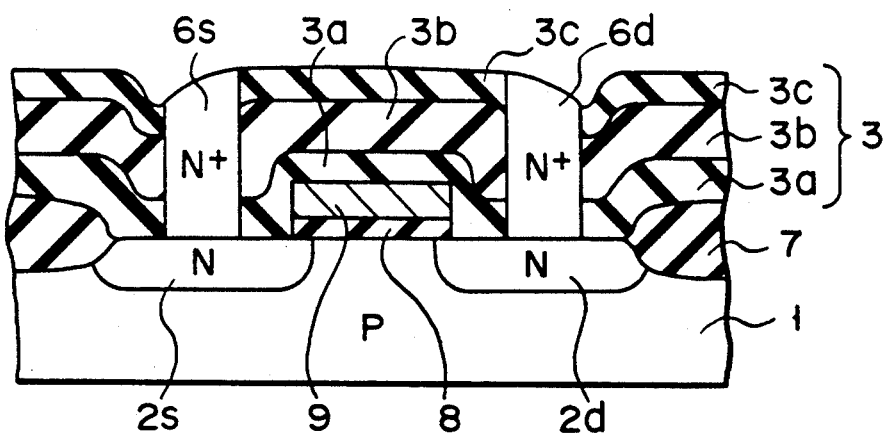
F I G. 1D
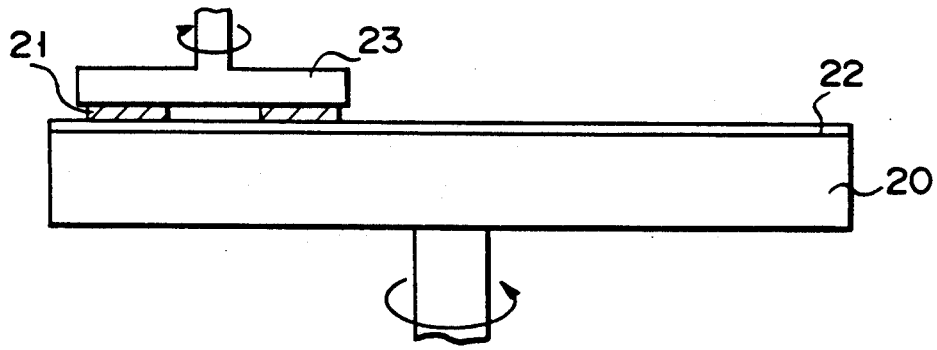
F I G. 1E
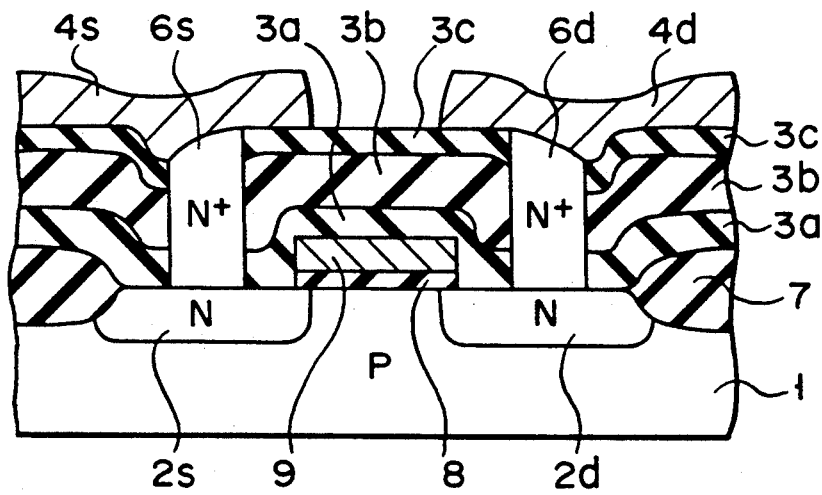
F I G. 1F

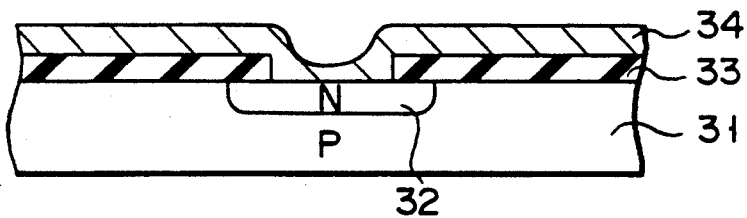
F I G. 2
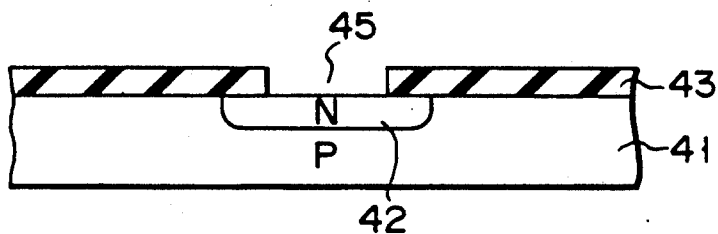
F I G. 3A
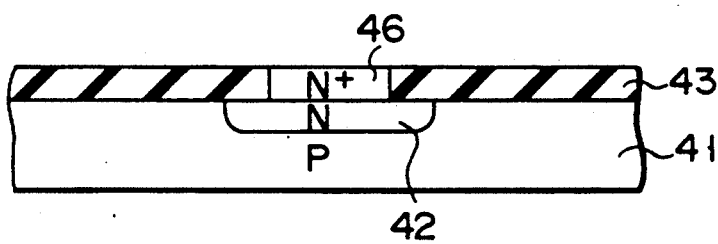
F I G. 3B
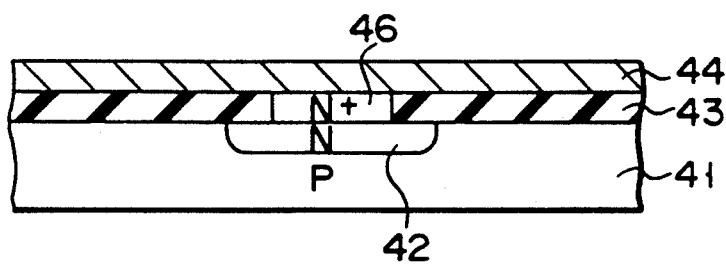
F I G. 3C
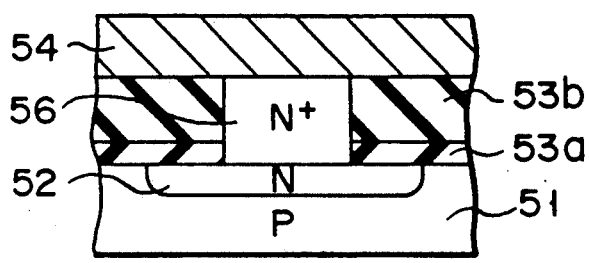
F I G. 4

METHOD OF MANUFACTURING A SEMICONDUCTOR DEVICE USING A POLISHING STEP PRIOR TO A SELECTIVE VAPOR GROWTH STEP

This application is a continuation of U.S. patent application Ser. No. 07/506,182, filed Apr. 9, 1990, now abandoned.

BACKGROUND OF THE INVENTION

1. Field of the Invention

The present invention relates to a method of manufacturing a semiconductor device, in particular, to a method wherein a step of forming an electrode in a semiconductor integrated circuit (IC) has been improved.

2. Description of the Related Art

There is known a direct contact method as a method of forming an electrode in a semiconductor IC. FIG. 2 is a partial cross-sectional view of a conventional semiconductor IC manufactured by the direct contact method, showing a drain region of a MOS transistor (MOS FET) serving as an element of a static RAM or a mask ROM. An N-type diffusion region 32 is formed in a major surface of a P-type substrate 31. The region 32 becomes a drain region exposed to the substrate 31. Then, an insulating film 33 is deposited on the substrate 31. An opening is formed in the insulating film 33 so as to reach the diffusion region 32. A polycrystalline silicon layer is deposited over the resulting structure by a CVD (Chemical Vapor Deposition) method. The polycrystalline silicon layer is patterned to form a wiring layer 34.

When the above-described method is used, it is difficult, however, to sufficiently reduce an electric resistance or a contact resistance between the polycrystalline silicon wiring layer 34 and the drain region 32.

As a conventional method capable of reducing the electric resistance, a method, as illustrated in FIGS. 3A to 3C, has been proposed. In FIG. 3A, an N-type diffusion region 42 is formed in a major surface of a P-type substrate 41. The region 42 becomes a drain region exposed to the substrate 41. Then, an insulating film 43 is deposited on the substrate 41. An opening 45 is formed in the insulating film 43 so as to reach the drain region 42. In FIG. 3B, by using a selective epitaxial growth method, the opening 45 is filled with a single-crystal silicon layer 46 containing N type impurities. Thereafter, as shown in FIG. 3C, a polycrystalline silicon layer is deposited on the resulting structure, and is patterned to form a wiring layer 44.

According to this method, the low-resistance silicon layer 46 containing the impurities serves to reduce the electric resistance between the wiring layer 44 and the drain region 42.

However, the formation of the silicon layer with use of the selective growth method incurs problems relating to the prevention of precipitation of silicon on the insulating layer, the removal of precipitated silicon, etc. If parameters of conditions for the selective growth, such as reaction gas density or temperature, are set to optimal values, and cleanness in the reaction vessel is maintained, the possibility of precipitation of silicon on the insulating film is kept low, and no problem would occur.

Continuous selective growth would sometimes make it difficult to maintain the above ideal conditions. Consequently, silicon is precipitated on the insulative layer. Further, polycrystalline silicon is deposited on the precipitated silicon to form a projection. In this case, it is difficult to fatten or eliminate the projection. The precipitated silicon may cause a shortcircuit in the wiring, and the manufacturing yield of semiconductor devices decreases considerably.

FIG. 4 is a cross-sectional view of another conventional semiconductor device manufactured by the above-described selective growth method. This semiconductor device is a dynamic RAM. FIG. 4 shows, in particular, an area including a drain region of a MOS transistor which constitutes the dynamic RAM. An N-type diffusion region (drain region) 52 is formed in a P-type substrate 51 so as to be exposed to the surface of the substrate 51. A silicon oxide film 53a and a BPSG (boron-phospor-silicon glass) film 53b are sequentially deposited on the substrate 51. An opening is formed in the silicon oxide film 53a and the BPSG film 53b, and a silicon layer 56 containing impurities is filled in the opening by the selective growth method. Thereafter, an aluminum-silicon alloy layer is deposited on the resulting structure, and the alloy layer is patterned to form a wiring layer 54.

Like the method shown in FIGS. 3A to 3C, this method is effective in reducing the electric resistance between the drain region 52 and the wiring layer 54. However, in this method, similar problems remain to be solved. Namely, dust of several μm adheres to the surface of the BPSG film, in the process of filling the opening with the silicon layer 56 by the selective growth method. The dust originates from a silicon thin film deposited on the inner wall of the growth apparatus, or from a quartz or silicon oxide film forming the inner wall of the apparatus. The silicon growth is normally performed in a vessel having a reduced pressure. Thus, the silicon thin film or the silicon oxide film is easily peeled at the time of supplying/exhausting the air in/from the vessel. The peeled film is attached on the surface of the BPSG film 53b. In addition, during the selective growth, the substrate is heated up to 900° C. As a result, the BPSG film 53b is melted, and dust attached on the surface of the BPSG film 53b is more firmly attached on or in the film 53b. In the process of depositing the aluminum-silicon alloy layer, subsequent to the process of selective growth of single-circuiting silicon layer 56, the dust attached firmly adhered on the underlying BPSG film 53b causes deficiencies in the wiring layer 54, such as interlayer short-circuiting or breaking of wire.

Dust of the particle size of 1/10 or more of a distance between wires may cause deficiencies in the wiring layer, and this problem becomes more significant as the number of integrated elements increases.

As described above, the direct contact method of forming an electrode connected to the diffusion layer cannot sufficiently reduce the electric resistance at the contact portion. This problem may be solved by the method of forming the opening in the interlayer insulative layer on the diffusion region, filling the silicon layer in the opening by the selective vapor deposition process, and forming the electrode. This method has been widely used with the miniaturization of elements. However, when the silicon layer is filled in the opening by the selective vapor deposition, silicon may be precipitated on the insulative layer or dust may be adhered thereon, resulting in the deficiency in wiring, such as an interlayer short-circuit, and the lowering in the manufacturing yield.

SUMMARY OF THE INVENTION

The object of the present invention is to provide a method of manufacturing a semiconductor device, wherein wiring defects due to precipitated silicon or dust on the surface of an insulative film of the semiconductor device can be reduced, and the manufacturing yield is improved.

A method of manufacturing a semiconductor device, according to the present invention, comprises the steps of: performing selective vapor growth on a semiconductor substrate; and polishing a surface of an insulative film formed on said semiconductor substrate subsequent to the selective vapor growth step.

According to this method, the surface of the insulative film formed on the substrate is polished to remove the precipitated silicon or dust on the surface of the insulative film. Thus, wiring defects due to the precipitated silicon or dust of the semiconductor device can be reduced, and the manufacturing yield is improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to FIG. 1F are cross sections, sequentially illustrating a method of manufacturing a semiconductor device, according to an embodiment of the present invention;

FIG. 2 is a cross-sectional view of a conventional semiconductor device;

FIGS. 3A to FIG. 3C are cross sections illustrating a method of manufacturing another conventional semiconductor device; and FIG. 4 is a cross-sectional view illustrating a method of manufacturing still another conventional semiconductor device.

DETAILED DESCRIPTION OF THE PREFERRED EMBODIMENTS

An embodiment of the present invention will now be described with reference to the accompanying drawings.

FIGS. 1A to FIG. 1F are cross-sectional views sequentially illustrating a method of manufacturing a MOS transistor, in the case where the present invention is applied to the manufacture of a static RAM, a mask ROM, etc. The MOS transistor is a structural element of the static RAM, mask ROM, etc.

First, as shown in FIG. 1A, an element separation field oxide film 7 is selectively formed in a P-type silicon semiconductor substrate 1 having, e.g., 1Ω.cm, by means of a normal LOCOS (Local Oxidation of Silicon) method. A gate electrode 9 comprising a gate oxide film 8 and a polycrystalline silicon layer is formed on that area of the surface of the substrate 1 which is surrounded by the field oxide film 7. With the field oxide film 7 and the gate electrode 9 used as a mask, impurities are ion-implanted in a major surface of the substrate 1, thus forming a source region 2s and a drain region 2d exposed to the major surface of substrate 1. Then, a silicon oxide film 3a having a thickness of, e.g., 3000 Å is deposited on the resulting structure by means of a CVD (Chemical Vapor Deposition) method. A BPSG (Boron-Phosphor-Silicon Glass) layer 3b having a thickness, e.g., 7000 Å is deposited on the silicon oxide film 3a. The BPSG film 3b is annealed in an atmosphere of POCl$_3$ for 60 minutes at a temperature of, e.g., 950° C., so that the surface of the BPSG film 3b is flattened.

As shown in FIG. 1B, a silicon oxide film 3c including no B (boron) or P (phosphor) having a thickness of, e.g., 1000 Å is deposited on the BPSG film 3b by means of a CVD method.

Then, as shown in FIG. 1C, by means of a conventional PEP (photo-etching process) method (e.g., reactive ion etching), openings (contact holes or through-holes) 5s and 5d are formed in an insulative lamination film 3 (consisting of the silicon oxide film 3c, BPSG film 3b and silicon oxide film 3a) so as to reach the surfaces of the source region 2s and drain region 2d.

In a step shown in FIG. 1D, silicon layers 6s and 6d doped with impurities are filled in the source contact hole 5s and the drain contact hole 5d by means of a selective growth method. The selective growth method is performed, for example, under the following conditions: the flow rate of H$_2$ gas is 100/min., the flow rate of SiH$_2$Cl$_2$ is 400 ml/min., the flow rate of HCl gas is 1 l/min., and the flow rate of PH$_3$ gas or a doping gas is 10 ml/min. These gases are supplied to a reaction chamber. The pressure in the reaction chamber is reduced to 100 Torr, and the temperature in the chamber is set to 900° C. If the selective growth method is performed at a temperature 900° C., an impurity of P (phosphor) contained in the doping gas is diffused into the substrate 1, thus reducing the contact resistance between the diffusion regions 2s and 2d and the silicon layers 6s and 6d is reduced.

After the silicon layers 6s and 6d are formed, the surface of the insulative layer 3 is polished. FIG. 1E is illustrative of the polishing process. A substrate (or a wafer) 21 is attached on a polishing plate 23. The wafer 21 is polished on a rotating table 20 on which a polishing cloth is laid. The polishing is carried out under a pressure of 220 g/cm$^2$. A polishing material was formed in the following manner. An alkaline solution (pH=10.5) was prepared by dissolving silicon oxide particles (particle size: 0.01 μm) in NH$_4$OH. The alkaline solution was mixed with water. The volume ratio of the alkaline solution to the water is 1:5. The polishing time was ten minutes. Under the above conditions, the degree of polished silicon oxide (SiO$_2$) was small, i.e., 0 to 0.05 μm, compared to the degree of polished silicon (Si) which was about 2 μm.

Then, the entire substrate is subjected to ultrasonic rinsing with a frequency of 0.9 MHz and an output power of 500 W. As a rinsing liquid, pure water may be used.

In a step shown in FIG. 1F, an alloy layer formed of aluminum containing about 1% of silicon, the thickness of which is, e.g., 7000 Å, is deposited over the resulting structure. The alloy layer is patterned to form a source wiring layer 4s and a drain wiring layer 4d which are brought into electrical contact with the surfaces of the silicon layers 6s and 6d filled in the contact holes.

When the silicon layers are filled in the contact holes under the above condition of selective growth, a thickness of dust accumulated on the silicon oxide film 3c, such as silicon particles or silicon-based by-product, is about 1 μm. The above-described polishing step is a mechanical/chemical polishing step for selectively polishing the silicon. Though the silicon is polished to a large degree, the silicon oxide film is hardly polished. Thus, substantially only the silicon particles or dust on the insulative film is removed. Consequently, when the Al—Si alloy layer is deposited on the underlying silicon oxide film 3c to form the wiring layer, the silicon particles or dust on the silicon oxide film 3c can be removed, and the possibility of malefaction of the wiring layer, such as short-circuiting, can be reduced.

For example, when a wiring layer is formed with a design rule of 1.2 μm, the yield in the wiring step is conventionally 88%. However, if the method of the present invention is used, the yield increases to 98%.

In the above embodiment, the silicon oxide film 3c is deposited after annealing the BPSG film 3b. However, any material which is less polished than silicon may be used. For example, PSG (phosphor silicate glass) film, SiN (silicon nitride) film, etc. may be used. Further, in this embodiment, the silicon oxide film 3c may not be deposited. In other words, the PSG film, BPSG film are melted at a certain temperature in the selective growth step, and the silicon particles are securely attached. However, the attached particles are easily removed by the mechanical/chemical polishing method of the present invention for selectively polishing silicon.

The present invention is not limited to the above embodiment, and various modifications can be made. For example, in the above embodiment, the MOS transistor is formed in the P-type substrate. The MOS transistor may be formed in a P-type well region in an N-type substrate. Further, the above embodiment is directed to the manufacture of the N-channel MOS transistor. The present invention, however, is applicable to the manufacture of a P-channel MOS transistor.

The above embodiment is directed to the method of manufacturing a semiconductor device such as a static RAM or a mask ROM having a MOS transistor as a structural element. However, this invention is also applicable to a method of manufacturing other types of semiconductor devices having an electrode forming structure wherein a wiring layer and a diffusion layer (active layer), between which an insulative film is interposed, are connected by a silicon semiconductor layer formed by means of selective vapor deposition.

Furthermore, in the above embodiment, impurities are doped in the selectively grown silicon semiconductor layer by using $PH_3$ gas. However, it is also possible to dope impurities by means of ion implantation after the selective growth.

In the present invention, after the silicon semiconductor layers are selectively grown in the openings by means of the selective vapor deposition process, the surface of the insulative film is polished. Thus, precipitated silicon or dust on the insulative layer can be almost completely removed. Therefore, the present invention can provide a method of manufacturing a semiconductor device, wherein wiring deficiencies due to precipitated silicon, etc. can be remarkably reduced, and lowering of the manufacturing yield can be prevented.

Additional advantages and modifications will readily occur to those skilled in the art. Therefore, the invention in its broader aspects is not limited to the specific details, and representative devices, shown and described herein. Accordingly, various modifications may by without departing from the spirit or scope of the general inventive concept as defined by the appended claims and their equivalents.

What is claimed is:

1. A method of manufacturing a semiconductor device, comprising the steps of:
    forming an insulative film on a semiconductor substrate of said device;
    forming a hole in said insulative film;
    performing selective vapor growth to form a conductive layer in said hole on said semiconductor substrate; and
    removing silicon particles from said semiconductor substrate by polishing a substantially entire surface of said insulating film formed on said semiconductor substrate subsequent to the selective vapor growth to produce a reduction in thickness of the insulating film of 0.05 micron maximum, the polishing being performed by using cloths containing an alkaline solution having silicon oxides particles dissolved therein.

2. A method according to claim 1, further comprising the step of forming a BPSG (boron-phosphorus-silicon glass) film adjacent to said insulating film.

3. A method according to claim 1, wherein said selective vapor growth step is performed on a semiconductor device including the semiconductor substrate, diffusion regions, the insulative film, and an electrode.

4. A method according to claim 3, wherein said selective vapor growth step includes a step of forming openings in said insulative film so as to reach the diffusion regions.

5. A method according to claim 1, wherein said selective vapor growth step is performed with use of $SiH_2Cl_2$ gas.

6. A method according to claim 1, wherein said selective vapor growth step is performed with use of HCl gas.

7. A method according to claim 1, wherein said selective vapor growth step is performed with use of $PH_3$ gas.

8. A method according to claim 1, wherein said alkaline solution is $NH_4OH$.

9. A method of manufacturing a semiconductor device, comprising the steps of:
    forming an insulative film on a semiconductor substrate of said device;
    forming a hole in said insulative film;
    performing selective vapor growth to form a conductive layer in said hole on said semiconductor substrate;
    removing silicon particles from said semiconductor substrate by polishing a substantially entire surface of said insulating film formed on said semiconductor substrate subsequent to the selective vapor growth to produce a reduction in thickness of the insulating film of 0.05 micron maximum, the polishing being performed by using cloths containing an alkaline solution having silicon oxide particles dissolved therein; and
    rinsing said semiconductor substrate subsequent to said polishing step.

10. The method according to claim 9, wherein said rinsing step is an ultrasonic rinsing step.

11. The method according to claim 9, wherein said rinsing step is performed with use of pure water.

* * * * *